United States Patent [19]

Arita

[11] 3,865,650

[45] Feb. 11, 1975

[54] METHOD FOR MANUFACTURING A MOS INTEGRATED CIRCUIT

[75] Inventor: Shigeru Arita, Ibaragi, Japan

[73] Assignee: Matsushita Electronics Corporation, Osaka, Japan

[22] Filed: Mar. 12, 1973

[21] Appl. No.: 340,254

[30] Foreign Application Priority Data

Mar. 10, 1972 Japan ............................... 47-24912

[52] U.S. Cl. ..................... 148/187, 29/571, 29/577, 29/578, 357/23, 357/41, 357/45, 357/86, 148/189

[51] Int. Cl. ...... H01l 7/44, B01j 17/00, H01l 11/00

[58] Field of Search ........... 148/187; 317/235, 239, 317/22, 22.2; 29/571, 577, 578

[56] References Cited

UNITED STATES PATENTS

| | | | |
|---|---|---|---|
| 3,443,176 | 5/1969 | Agusta et al. | 317/235 |
| 3,519,504 | 7/1970 | Cuomo | 148/187 |
| 3,608,189 | 9/1971 | Gray | 29/571 |
| 3,649,885 | 3/1972 | Nienhuis | 317/235 |
| 3,696,276 | 10/1972 | Boland | 317/235 |
| 3,698,077 | 10/1972 | Dahlberg | 29/578 |
| 3,739,238 | 6/1973 | Hara | 317/235 |
| 3,747,200 | 7/1973 | Rutledge | 29/571 |

*Primary Examiner*—G. Ozaki
*Assistant Examiner*—W. G. Saba
*Attorney, Agent, or Firm*—Stevens, Davis, Miller & Mosher

[57] ABSTRACT

This invention relates to a method for manufacturing a MOS integrated circuit, especially to a method for connecting two regions in a MOS integrated circuit, wherein the connection is performed by means of a diffusion region formed prior to forming the gate portion and said diffusion region is a conductivity type opposite to that of a silicon substrate. According to the invention, it is not necessary to interconnect the two regions on the surface of the silicon substrate, so that a higher degree of integration will be attained as compared with the prior art.

4 Claims, 7 Drawing Figures

METHOD FOR MANUFACTURING A MOS INTEGRATED CIRCUIT

This invention relates to a method for manufacturing a MOS integrated circuit, especially to a method for connecting two regions in a MOS integrated circuit. In the field of MOS integrated circuits, especially of MOS LSI in which a higher degree of integration is attained, the self-alignment method of manufacture may be adapted.

When the MOS LSI is constructed by the self-alignment method, it is generally impossible to use aluminum as a gate electrode because the melting point of aluminum is below the diffusion temperature, thus polysilicon or molybdenum etc. are often employed therefor.

Figure 1A:
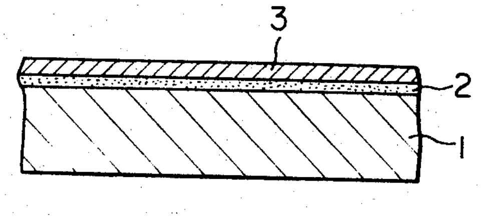
FIG. 1a PRIOR ART
Figure 1B:
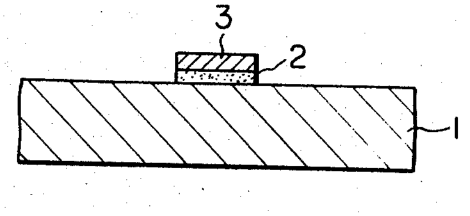
FIG. 1b PRIOR ART
Figure 1C:
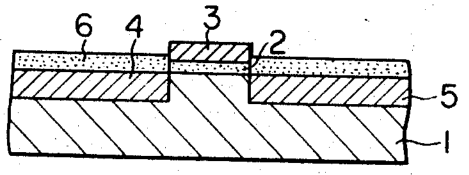
FIG. 1c PRIOR ART
Figure 2:
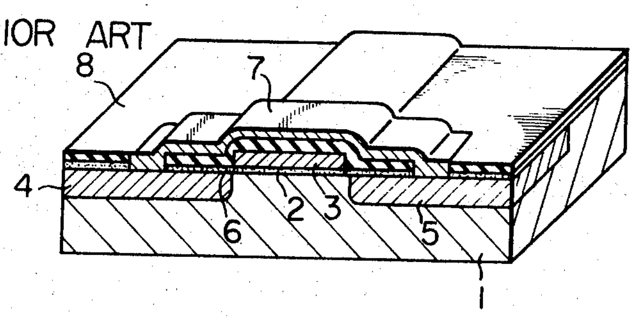
FIG. 2 PRIOR ART
Figure 3A:
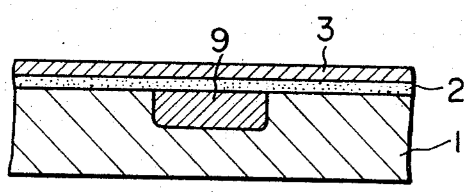
Figure 3B:
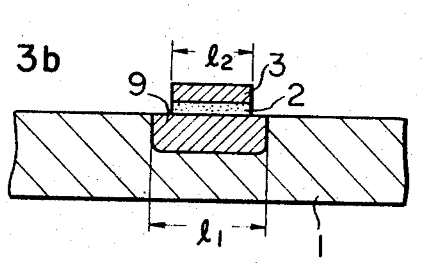
Figure 3C:
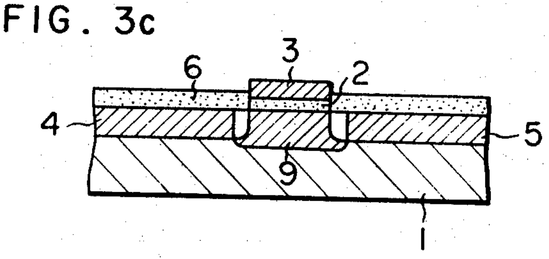

This invention will be clarified in the following description given with reference to the accompanying drawings in which:

FIGS. 1*a*, 1*b* and 1*c* show the construction process of MOS field effect transistor, wherein molybdenum is employed for a gate electrode;

FIG. 2 shows the method for connecting two regions together in accordance with the prior art; and FIGS. 3*a*, 3*b* and 3*c* show the method of connecting two regions in accordance with the invention.

The process of manufacturing MOS field effect transistors in accordance with a conventional method is shown in FIGS. 1*a* to 1*c*, wherein the gate electrode is of molybdenum. As seen from these figures, a silicon oxide layer 2 is formed on the whole surface of a silicon substrate 1, and subsequently a molybdenum layer 3 is formed on the silicon oxide layer 2 as shown in FIG. 1*a*. As shown in FIG. 1*b*, then the silicon oxide and molybdenum layers are etched away excluding one portion thereof designated by numerals 2 and 3. Then, a dopant of conductivity type opposite to that of the silicon substrate is diffused into the silicon substrate 1 so that only the portion just under the silicon oxide and molybdenum layers remains diffused.

As the result of the diffusion process, a drain region 4 and a source region 5 are formed in the silicon substrate, which both regions have the conductivity type opposite to that of the silicon substrate, whereby the MOS field effect transistor is constructed as shown in FIG. 1*c*. In this figure, numeral 6 designates the silicon oxide layer formed during the diffusion of the dopant.

According to such a self-alignment method, a plurality of MOS field effect transistors can be constructed in a single silicon substrate by only one diffusion process. However, this method has some defects in constructing actual circuits, for instance, in a case where it is required to connect the drain and source regions together in a MOS field effect transistor.

As apparent from the above description, a dopant can be diffused into the silicon substrate excluding a portion just under the molybdenum layer which serves as a gate portion. Thus, as shown in FIG. 2, it is necessary to interconnect two regions with a metal strip 7 crossing over the gate region. In the figure numeral 8 is an insulating layer, such as a silicon oxide layer. It is undesirable for a high degree of integration in that the metal strip occupies a portion of the silicon substrate in such a conventional method.

The present invention is accomplished to solve the above-mentioned problems in the conventional method, and an object of the present invention is to provide a method for connecting two regions together in a MOS field effect transistor formed by the self-alignment method without a metal strip.

According to the method of the invention remarkable effects can be obtained manufacturing MOS LSI in accordance with the self-alignment method.

The description will be made hereinbelow with respect to the case of using molybdenum as a gate electrode, but is not limited to this case. The invention can be adapted to the case of using polysilicon etc. as a gate electrode. The present invention will be explained by the following description in connection with FIGS. 3*a* to 3*c*. As shown in FIG. 3*a*, in accordance with the method of the invention, a diffusion region 9 being of a conductivity type opposite to that of a silicon substrate 1 is firstly formed just under a portion which will be the gate portion. Subsequently a gate oxide layer 2 and a molybdenum layer 3 are formed on the surface of the silicon substrate 1 in the order mentioned. Then, the gate oxide layer 2 and molybdenum layer 3 are etched away except the gate portion. In this etching process it is desirable to limit the width $e_2$ of the gate portion remaining on the silicon substrate so as to be equal to or smaller than the width of the diffusion region $e_1$ as shown in FIG. 3*b* .

A dopant is diffused into the silicon substrate 1, so that a drain region 4 and a source region 5 each thereof having the conductivity type opposite to that of silicon substrate 1 are formed. As the result of this process, each one end of each of the drain region 4 and source region 5 is spread to the diffusion region which has been previously formed in the silicon substrate as shown in FIG. 3*c*. Namely, the drain and source regions are interconnected through the diffusion region 9.

According to this method for connecting the two regions together in a semiconductor substrate, a connecting means does not occupy a section on the silicon substrate, and therefore a high degree of integration can be attained.

What we claim is:

1. A method for manufacturing a MOS integrated circuit comprising the steps of:

forming at least one selected diffusion region on a silicon substrate by a dopant of a conductivity type opposite to that of said silicon substrate;

forming a double layer comprising a gate oxide layer and a gate electrode layer on said silicon substrate;

removing said double layer excluding a strip portion thereof, which serves as a gate region, in such a way that the width of strip portion remaining on said silicon substrate is equal to or smaller than the width of said diffusion region; and diffusing a dopant into said silicon substrate by using said gate strip section as a mask, thereby forming a plurality of drain and source regions, each thereof being of a conductivity type opposite to that of said silicon substrate, on both sides of said gate strip portion; whereby at least one pair of said drain and source regions is electrically interconnected by means of said diffusion region.

2. The method according to claim 1, wherein the gate electrode layer is made of molybdenum.

3. The method according to claim 1, wherein the gate electrode layer is made of polysilicon.

4. The method according to claim 1, wherein the width of said diffusion region in the transverse direction is equal to or longer than that of said gate strip portion.

* * * * *